(12) United States Patent
Kaiwa et al.

(10) Patent No.: US 11,218,031 B2
(45) Date of Patent: Jan. 4, 2022

(54) PLANAR-TYPE WIRELESS POWER-RECEIVING CIRCUIT MODULE

(71) Applicant: Murata Manufacturing Co., Ltd., Kyoto-fu (JP)

(72) Inventors: Koyo Kaiwa, Nagaokakyo (JP); Tatsuya Hosotani, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 17/151,127

(22) Filed: Jan. 16, 2021

(65) Prior Publication Data

US 2021/0143685 A1 May 13, 2021

Related U.S. Application Data

(63) Continuation of application No. PCT/JP2019/015722, filed on Apr. 11, 2019.

(30) Foreign Application Priority Data

Sep. 25, 2018 (JP) .............................. JP2018-178810

(51) Int. Cl.
*H02J 50/70* (2016.01)
*H02J 50/10* (2016.01)
(Continued)

(52) U.S. Cl.
CPC .............. *H02J 50/70* (2016.02); *H01F 27/02* (2013.01); *H01F 27/36* (2013.01); *H01F 38/14* (2013.01);
(Continued)

(58) Field of Classification Search
CPC .. H02J 50/70; H02J 50/90; H02J 50/10; H02J 50/005; H01F 27/02; H01F 27/36;
(Continued)

(56) References Cited

U.S. PATENT DOCUMENTS

| 10,912,226 B2* | 2/2021 | Kweon | H02J 50/10 |
| 2007/0187137 A1* | 8/2007 | Isebo | H05K 1/183 |
| | | | 174/255 |
| 2021/0143686 A1* | 5/2021 | Hosotani | H02J 50/70 |

FOREIGN PATENT DOCUMENTS

| JP | 2012-221264 A | 11/2012 |
| JP | 2017-005952 A | 1/2017 |

(Continued)

OTHER PUBLICATIONS

International Search Report issued in PCT/JP2019/015722; dated Jun. 11, 2019.

(Continued)

*Primary Examiner* — Jared Fureman
*Assistant Examiner* — Michael J Warmflash
(74) *Attorney, Agent, or Firm* — Studebaker & Brackett PC

(57) ABSTRACT

A planar-type wireless power-receiving circuit module includes a planar ground conductor, a substrate, a power-receiving coil, and a magnetic sheet. The planar ground conductor has a cavity in the middle section thereof. The substrate is disposed on a first main surface of the planar ground conductor. The substrate includes dielectric layers stacked on top of each other in a manner so as to form electronic circuitry. The power-receiving coil is electrically connected to the electronic circuitry and is disposed in the cavity. The magnetic sheet overlaps the power-receiving coil when the planar ground conductor is viewed in plan. The magnetic sheet is part of a path of magnetic flux passing through the power-receiving coil and is disposed on a first main surface of the power-receiving coil.

20 Claims, 6 Drawing Sheets

(51) Int. Cl.
  *H02J 50/00* (2016.01)
  *H01F 27/02* (2006.01)
  *H01F 27/36* (2006.01)
  *H01F 38/14* (2006.01)
  *H02J 50/90* (2016.01)
  *H01F 27/24* (2006.01)

(52) U.S. Cl.
  CPC ............ *H02J 50/005* (2020.01); *H02J 50/10* (2016.02); *H02J 50/90* (2016.02); *H01F 27/24* (2013.01)

(58) Field of Classification Search
  CPC ........ H01F 38/14; H01F 27/24; H01F 27/366; H04B 5/0037; H01L 23/12; H01L 23/00
  See application file for complete search history.

(56) References Cited

FOREIGN PATENT DOCUMENTS

| | | |
|---|---|---|
| JP | 2018-102124 A | 6/2018 |
| WO | 2018/012378 A1 | 1/2018 |

OTHER PUBLICATIONS

Written Opinion issued in PCT/JP2019/015722; dated Jun. 11, 2019.

* cited by examiner

PLANAR-TYPE WIRELESS POWER-RECEIVING CIRCUIT MODULE

CROSS-REFERENCE TO RELATED APPLICATIONS

This application claims benefit of priority to International Patent Application No. PCT/JP2019/015722, filed Apr. 11, 2019, and to Japanese Patent Application No. 2018-178810, filed Sep. 25, 2018, the entire contents of each are incorporated herein by reference.

BACKGROUND

Technical Field

The present disclosure relates to a planar-type wireless power-receiving circuit module including predetermined electronic circuitry and configured to receive power wirelessly from the outside.

Background Art

A smart card configured to receive power wirelessly from the outside is disclosed in, for example, Japanese Unexamined Patent Application Publication No. 2012-221264, which describes a smart card with biometric authentication. The smart card includes, in addition to an IC chip for biometric authentication, a loop antenna for reception of power and a secondary battery. The smart card with biometric authentication is supplied with power stored in the secondary battery when performing, for example, biometric authentication.

The IC chip and the secondary battery are incorporated in the smart card, and the loop antenna for reception of power is embedded in a main body of the smart card. The loop antenna for reception of power and the IC chip overlap each other when viewed in plan.

SUMMARY

When being configured as described in Japanese Unexamined Patent Application Publication No. 2012-221264, a smart card with biometric authentication may be powered by a wireless power supply system with lower power efficiency. The reason is that the magnetic field coupling between the loop antenna for reception of power and an external loop antenna for transmission of power is not strong. Furthermore, unwanted magnetic field coupling can occur between the external loop antenna for transmission of power and an integrated circuit (IC) or any other electronic component incorporated in the smart card with biometric authentication. The unwanted magnetic field coupling can cause electromagnetic interference with electronic components or circuitry.

Accordingly, the present disclosure provides a planar-type wireless power-receiving circuit module powered by a wireless power supply system with improved power efficiency and capable of suppressing electromagnetic interference that can adversely affect electronic components or circuitry.

As an aspect of the present disclosure, a planar-type wireless power-receiving circuit module includes a planar ground conductor, a substrate, a power-receiving coil, and a magnetic sheet. The planar ground conductor has a cavity. The substrate is disposed on a first main surface of the planar ground conductor. The substrate includes dielectric layers stacked on top of each other in a manner so as to form electronic circuitry with electronic components mounted thereon. The power-receiving coil is electrically connected to the electronic circuitry and is disposed in the cavity. The magnetic sheet overlaps the power-receiving coil when the planar ground conductor is viewed in plan. The magnetic sheet is part of a path of magnetic flux passing through the power-receiving coil and is disposed on a first main surface of the power-receiving coil.

This enables the power-receiving coil to allow passage of the magnetic flux with high density through the cavity of the planar ground conductor. The magnetic sheet that is part of the magnetic path is conducive to enhancement of the magnetic flux passing through the power-receiving coil. The planar ground conductor provides magnetic shielding to isolate the circuitry from electric fields, and electromagnetic interference may be suppressed accordingly.

The present disclosure offers an advantage in that strong magnetic field coupling occurs between the power-receiving coil and a power-transmitting coil. Furthermore, electromagnetic interference caused by external magnetic fields and affecting the electronic components and the electronic circuitry of the power-receiving circuit module may be suppressed. This eliminates or minimizes the possibility that the electronic components or the electronic circuitry will malfunction. The power-receiving coil is disposed in a cavity of the substrate having the electronic circuitry formed therein. This makes it possible to provide a low-profile, planar-type wireless power-receiving circuit module. A small and thin wireless power supply system with improved power efficiency is provided accordingly.

DETAILED DESCRIPTION

Figure 1A:
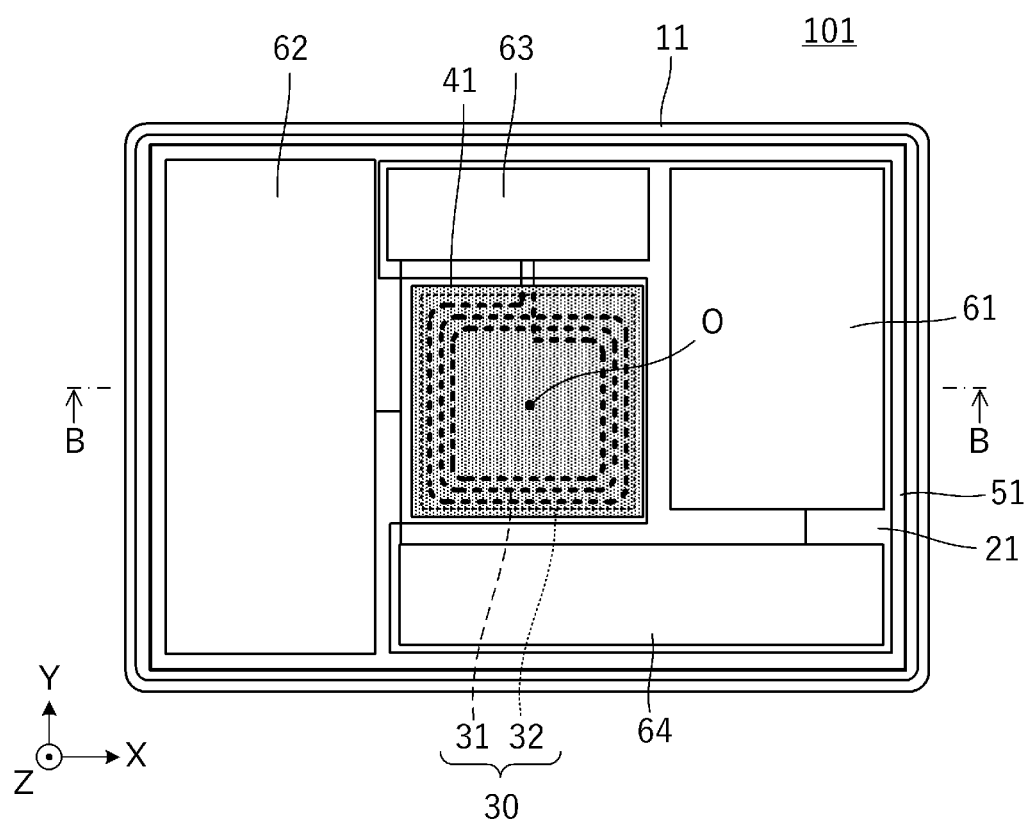
FIG. 1A is a plan view of a planar-type wireless power-receiving circuit module according to a first embodiment, with an upper portion of a housing of the module being omitted.

The following describes embodiments of the present disclosure by citing some specific examples with reference to the accompanying drawings. In the drawings, the same reference signs are used to refer to corresponding components. To give the main points or to facilitate understanding, several embodiments will be described separately for convenience. It should be noted that partial replacements or combinations of configurations illustrated in different embodiments are possible. Redundant description of features common to a first embodiment and another embodiment will be omitted, and a second embodiment and subsequent embodiments will be described with regard to only their distinctive features. Specifically, not every embodiment refers to actions and effects caused by similar configurations.

First Embodiment

Figure 1B:
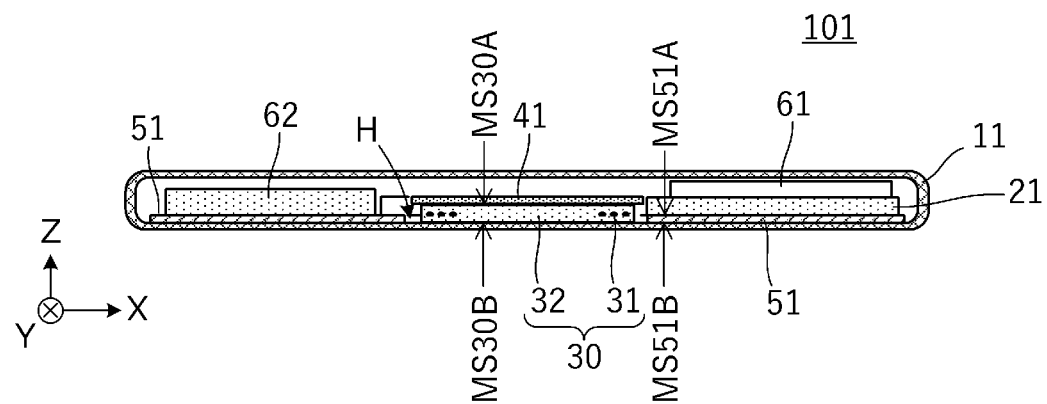
FIG. 1B is a sectional view of the planar-type wireless power-receiving circuit module taken along line B-B in FIG. 1A.
Figure 2:
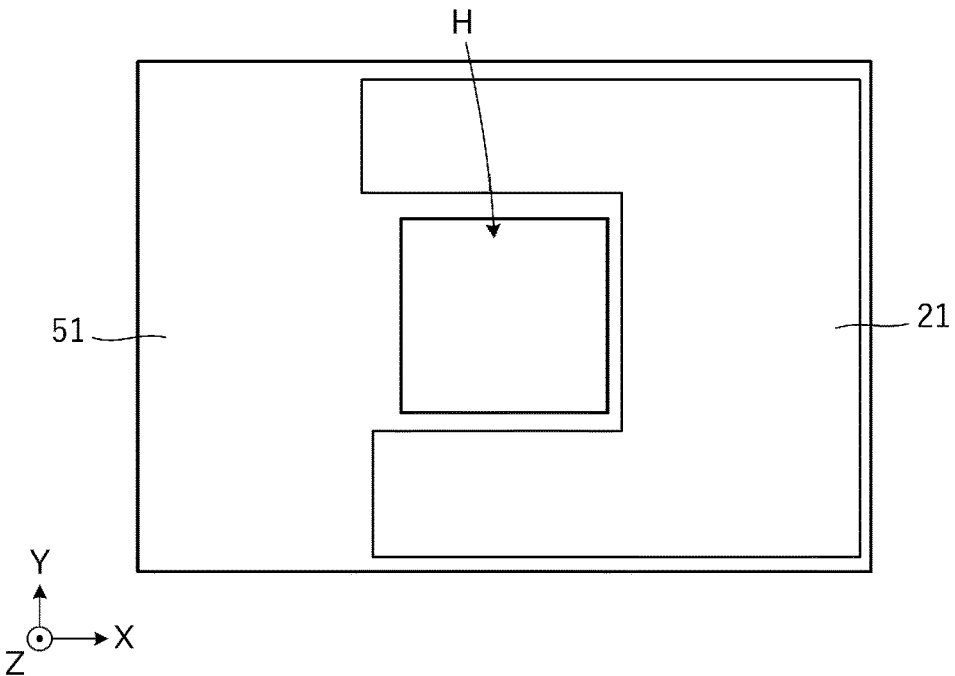
FIG. 2 is a plan view of a planar ground conductor and a substrate.

FIG. 1A is a plan view of a planar-type wireless power-receiving circuit module 101 according to a first embodiment, with an upper portion of a housing of the module being omitted. FIG. 1B is a sectional view of the planar-type wireless power-receiving circuit module 101 taken along line B-B in FIG. 1A. FIG. 2 is a plan view of a planar ground conductor 51 and a substrate 21.

The planar-type wireless power-receiving circuit module 101 includes the planar ground conductor 51 and the substrate 21 (see FIG. 2). The planar ground conductor has, in the middle section thereof, a cavity H, which has a square shape. The substrate 21 is disposed on a first main surface MS51A of the planar ground conductor 51. The substrate 21 is a multilayer substrate including dielectric layers stacked on top of each other in a manner so as to form electronic circuitry. The substrate 21 is a rigid substrate including an insulating base that is inflexible. The planar-type wireless power-receiving circuit module 101 includes a power-receiving coil 30. The power-receiving coil 30 is soldered to a conductor pattern formed in the substrate 21 and is electrically connected to the electronic circuitry accordingly. The power-receiving coil 30 is disposed in the cavity H. The power-receiving coil 30 includes a power-receiving coil substrate 32 and a power-receiving coil conductor 31, which is formed in the power-receiving coil substrate 32. The power-receiving coil substrate 32 is a flexible substrate and is a multilayer body including resin substrates each of which is made of a material with a low dielectric loss tangent and a low dielectric constant. More specifically, the power-receiving coil substrate 32 may be a multilayer body including resin substrates each of which is made of polytetrafluoroethylene (PTFE) or a liquid crystal polymer (LCP). The power-receiving coil conductor 31 is formed in the resin substrates and is spirally wound in a rectangular shape.

The planar-type wireless power-receiving circuit module 101 also includes a magnetic sheet 41. The magnetic sheet 41 may be a composite material including magnetic ferrite powder and a resin material and formed into a sheet or may be a thin plate of sintered magnetic ferrite. The magnetic sheet 41 has a square shape and is disposed on a first main surface MS30A of the power-receiving coil 30. The magnetic sheet 41 covers the entirety of the first main surface MS30A of the power-receiving coil 30; that is, the power-receiving coil 30 entirely fits within the magnetic sheet 41 when the planar ground conductor 51 is viewed in plan. The magnetic sheet 41 is part of a path of the magnetic flux passing through the power-receiving coil 30.

The planar-type wireless power-receiving circuit module 101 includes a housing 11, which is in the shape of a flat plate and accommodates the planar ground conductor 51, the substrate 21, a first functional circuit 64, a power-receiving circuit 63, a second functional circuit 61, a secondary battery 62, the power-receiving coil 30, and the magnetic sheet 41. The housing 11 is a flattened rectangular parallelepiped (in the shape of a card). The center of the housing 11 viewed in plan is denoted by O and is located within the outline of the power-receiving coil 30. In the present embodiment, the housing 11 and the power-receiving coil 30 are concentric about the center O.

The housing 11 is a molded body made of an electrical insulating and non-magnetic material. Specifically, the housing 11 is a resin molded article made of, for example, polyethylene terephthalate (PET), polyvinyl chloride (PVC), or polypropylene (PP). The planar ground conductor 51 is attached to an inner surface of a lower part of the housing 11. The power-receiving coil 30 is also attached to the inner surface of the lower part of the housing 11.

A second main surface MS30B of the power-receiving coil 30 is level a second main surface MS51B of the planar ground conductor 51.

The first functional circuit 64, the power-receiving circuit 63, and the second functional circuit 61 are formed on the substrate 21. The second functional circuit 61 includes, for example, a display circuit and an integrated circuit serving as an arithmetic processing circuit. The power-receiving circuit 63 is connected with the power-receiving coil conductor 31. The first functional circuit 64 includes integrated circuits such as a fingerprint recognition circuit and an electronic payment processing circuit. The secondary battery 62 is, for example, a lithium-ion battery (LIB) or an electric double-layer capacitor (EDLC).

Figure 3:
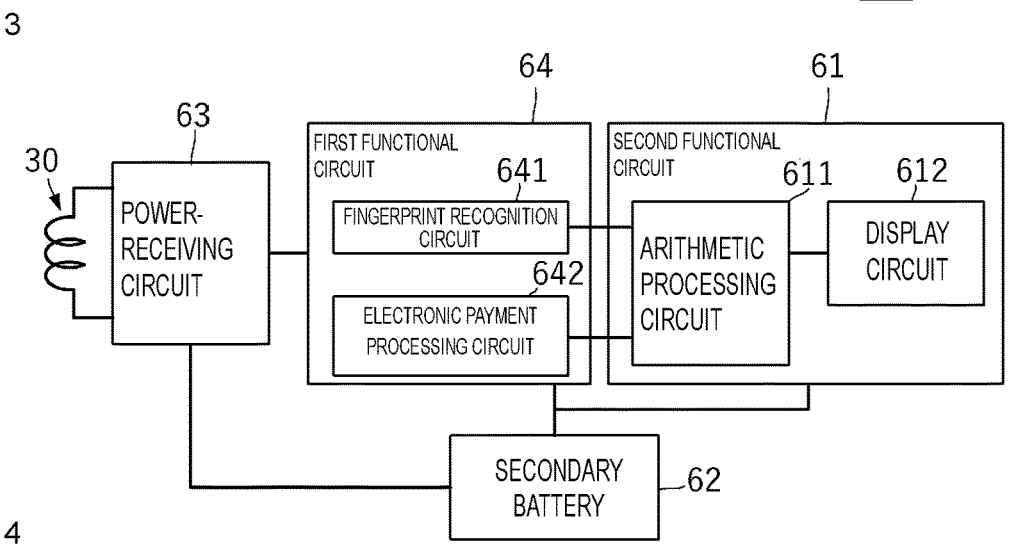
FIG. 3 is a block diagram of a circuit configuration of the planar-type wireless power-receiving circuit module.

FIG. 3 is a block diagram of a circuit configuration of the planar-type wireless power-receiving circuit module 101. The planar-type wireless power-receiving circuit module 101 includes the power-receiving circuit 63, the first functional circuit 64, the second functional circuit 61, and the secondary battery 62.

The first functional circuit 64 includes a fingerprint recognition circuit 641 and an electronic payment processing circuit 642. The second functional circuit 61 includes an arithmetic processing circuit 611 and a display circuit 612. The power-receiving circuit 63 supplies power to the secondary battery 62, which in turn provides supply voltage to the first functional circuit 64 and the second functional circuit 61.

During occurrence of magnetic field coupling between the power-receiving coil 30 and a power-transmitting coil of a wireless power-transmitting device that will be described later, the planar-type wireless power-receiving circuit module 101 according to the present embodiment receives power wirelessly, performs fingerprint recognition, and then executes predetermined payment processing in accordance with the result of fingerprint recognition.

Figure 4:
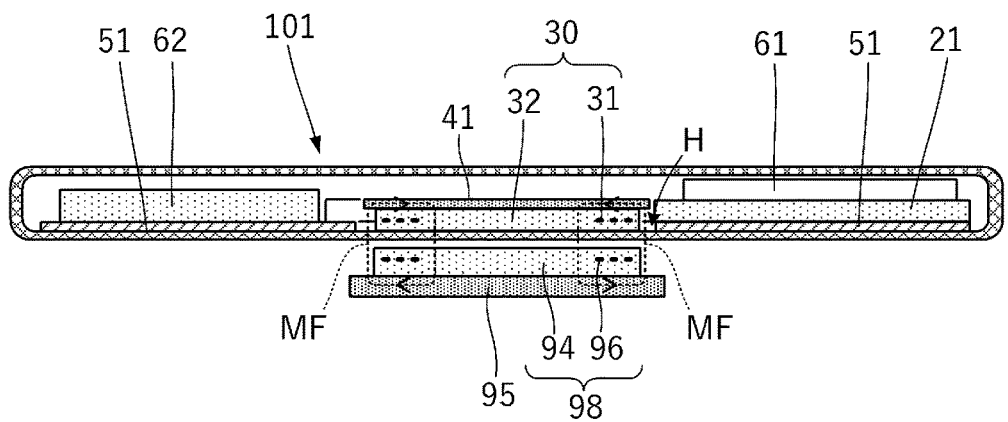
FIG. 4 is a sectional view, illustrating magnetic field coupling between a power-receiving coil of the planar-type wireless power-receiving circuit module and a power-transmitting coil.

FIG. 4 is a sectional view, illustrating magnetic field coupling between the power-receiving coil 30 of the planar-type wireless power-receiving circuit module 101 and a power-transmitting coil 98. The configuration of the planar-type wireless power-receiving circuit module 101 is as illustrated in FIG. 1B. The wireless power-transmitting circuit includes the power-transmitting coil 98 and a magnetic sheet 95. The power-transmitting coil 98 includes a power-transmitting coil substrate 94 and a power-transmitting coil conductor 96, which is formed in the power-transmitting coil substrate 94. As with the power-receiving coil conductor 31 in FIG. 1A, the power-transmitting coil conductor 96 is spirally wound in a rectangular shape. The power-transmitting coil 98 is disposed on the magnetic sheet 95. The above description regarding the material and form of the magnetic sheet 41 on the power-receiving coil 30 holds true for the magnetic sheet 95.

The power-receiving coil conductor 31 and the power-transmitting coil conductor 96 may be disposed in such a manner that their respective coil openings overlap each other with the planar ground conductor 51 being viewed in plan. In this state, magnetic field coupling occurs between the power-receiving coil conductor 31 and the power-transmitting coil conductor 96. Broken lines in FIG. 4 denote magnetic flux MF, which passes through the power-receiving coil conductor 31 and the power-transmitting coil conductor 96. The magnetic field coupling between the power-receiving coil conductor 31 and the power-transmitting coil conductor 96 occurs via the magnetic flux ME The magnetic sheets 41 and 95 constitute part of the magnetic path. That is, the magnetic sheets 41 and 95 allow closure of the magnetic field conducive to the coupling between the power-receiving coil conductor 31 and the power-transmitting coil conductor 96. The increased magnetic flux density resulting from the closure of the magnetic path strengthens the magnetic field coupling between the power-receiving coil conductor 31 and the power-transmitting coil conductor 96.

It is not required that the power-receiving coil conductor 31 and the power-transmitting coil conductor 96 be disposed with their respective coil openings being concentric. The magnetic field coupling between the power-receiving coil conductor 31 and the power-transmitting coil conductor 96 occurs when their respective coil openings viewed in plan overlap each other.

As illustrated in FIG. 1B, the second main surface MS30B of the power-receiving coil 30 is level with the second main surface MS51B of the planar ground conductor 51. The gap between the power-receiving coil 30 and the power-transmitting coil 98 is thus small, and the magnetic sheets 41 and 95 are close to each other accordingly. The position of the power-receiving coil 30 corresponds to the site where the density of the magnetic flux passing through the cavity H of the planar ground conductor 51 is high; that is, the power-receiving coil 30 allows passage of the magnetic flux with high density through the cavity H of the planar ground conductor 51. The power-receiving coil 30 and the power-transmitting coil 98 that are disposed with a small gap therebetween and the magnetic sheets 41 and 95 that are close to each other cause concentration of the magnetic flux between the power-receiving coil 30 and the power-transmitting coil 98. This eliminates or reduces unwanted magnetic field radiation to the outside.

The planar ground conductor 51 and the second functional circuit 61 extend along each other's surfaces and are close to each other. The second functional circuit 61 is discretely located away from a magnetic field-generating unit (i.e., the power-receiving coil 30 and the power-transmitting coil 98). The planar ground conductor 51 and the second functional circuit 61 overlap neither the power-receiving coil 30 nor the power-transmitting coil 98 when viewed in plan. This layout enables the planar ground conductor 51 to block the magnetic field that is radiated to the outside by the power-receiving coil conductor 31 and the power-transmitting coil conductor 96. This enables suppression of electromagnetic interference, thus eliminating or minimizing the possibility that the radiated magnetic field will cause the second functional circuit 61 to malfunction or will adversely affect the second functional circuit 61 in any other way.

The above description regarding the second functional circuit 61 holds true for the first functional circuit 64 and the power-receiving circuit 63.

The second functional circuit 61 on the substrate 21 and the planar ground conductor 51 extend along each other's surfaces and are close to each other. The region around the second functional circuit 61 and the planar ground conductor 51 are set to substantially the same potential accordingly. This enables the planar ground conductor 51 to shield the circuitry in the substrate 21 and the second functional circuit 61 from external electric fields.

The planar ground conductor 51 and the secondary battery 62 extend along each other's surfaces and are close to each other. The secondary battery 62 is discretely located away from the magnetic field-generating unit. The planar ground conductor 51 and the secondary battery 62 overlap neither the power-receiving coil 30 nor the power-transmitting coil 98 when viewed in plan. This layout enables the planar ground conductor 51 to block the magnetic field that is radiated to the outside by the power-receiving coil conductor 31 and the power-transmitting coil conductor 96. This enables suppression of electromagnetic interference, thus eliminating or minimizing the possibility that the radiated magnetic field will cause the secondary battery 62 to generate heat or will adversely affect the secondary battery 62 in any other way.

The planar ground conductor 51 and the secondary battery 62 extend along each other's surfaces and are close to each other. The region around the secondary battery 62 and the planar ground conductor 51 are set to substantially the same potential accordingly. The secondary battery 62 is thus shielded from external electric fields.

Owing to the configuration in the present embodiment, the planar-type wireless power-receiving circuit module is capable of receiving power with improved efficiency and is capable of suppressing electromagnetic interference that can adversely affect the IC chip, the secondary battery, or any other electronic component.

It is not required that the second main surface MS30B of the power-receiving coil 30 be level with the second main surface MS51B of the planar ground conductor 51. The second main surface MS30B of the power-receiving coil 30 may be closer to the second main surface MS51B than to the first main surface MS51A of the planar ground conductor 51. This may involve the aforementioned actions and effects.

Second Embodiment

The following describes a second embodiment, or more specifically, a planar-type wireless power-receiving circuit module in the form of a card for installation in a wireless power-transmitting device.

Figure 5:
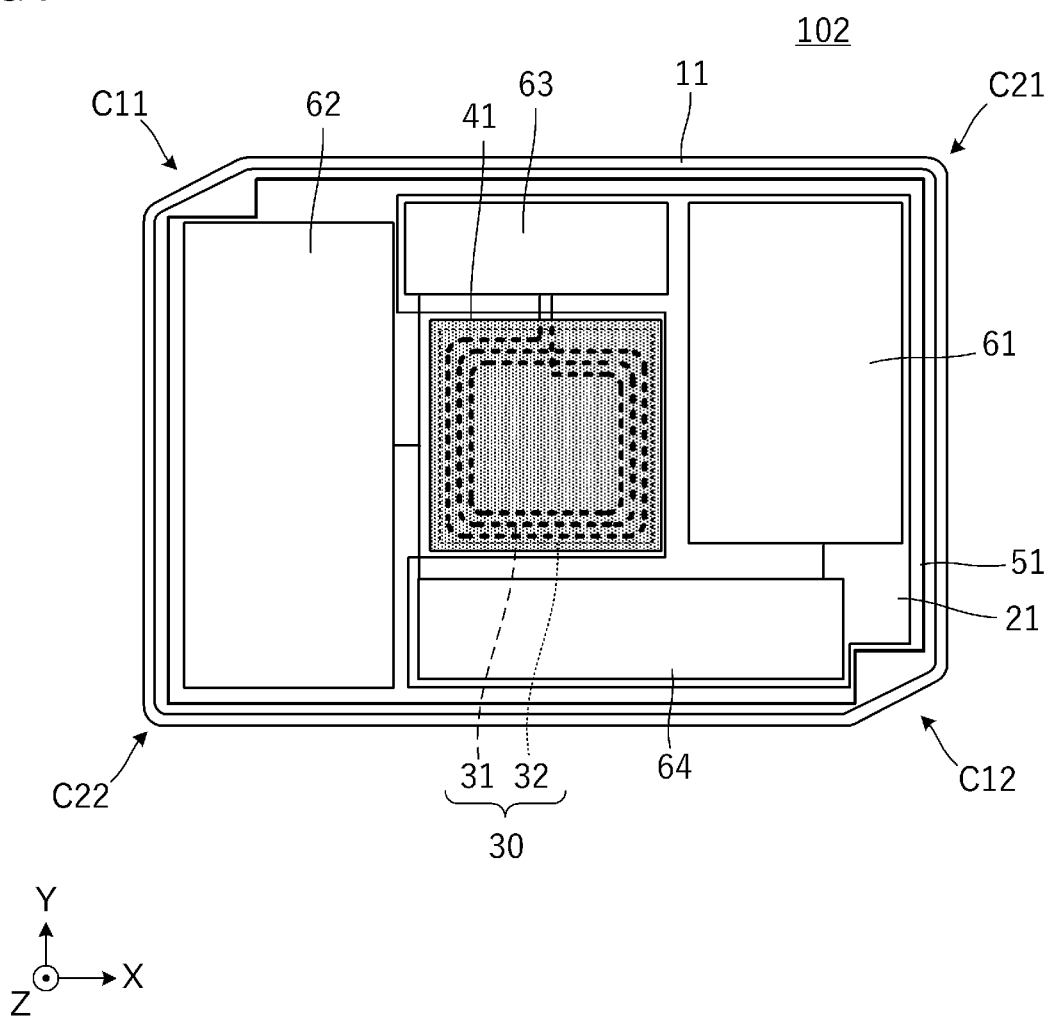
FIG. 5 is a plan view of a planar-type wireless power-receiving circuit module, with an upper portion of a housing of the module being omitted.

FIG. 5 is a plan view of a planar-type wireless power-receiving circuit module 102, with an upper portion of a housing of the module being omitted. The main difference between the planar-type wireless power-receiving circuit module 101 in FIG. 1A and the planar-type wireless power-receiving circuit module 102 is in the shape of the housing 11. When viewed in plan, the housing 11 of the planar-type wireless power-receiving circuit module 102 according to the present embodiment is substantially rectangular and has four corner sections, which are denoted by C11, C12, C21, and C22, respectively. The corner sections C11 and C12 are herein referred to as a first pair of diagonally opposite corners, and the corner sections C21 and C22 are herein referred to as a second pair of diagonally opposite corners. When viewed in plan, the first pair and the second pair have different shapes. In the present embodiment, neither the corner section C21 nor the corner section C22 has a cutout, whereas the corner sections C11 and C12 have diagonal cutouts. The planar-type wireless power-receiving circuit module 102 has a rotational symmetry of 180°; that is, its shape appears identical to its original shape when rotated 180° on a plane.

Figure 6A:
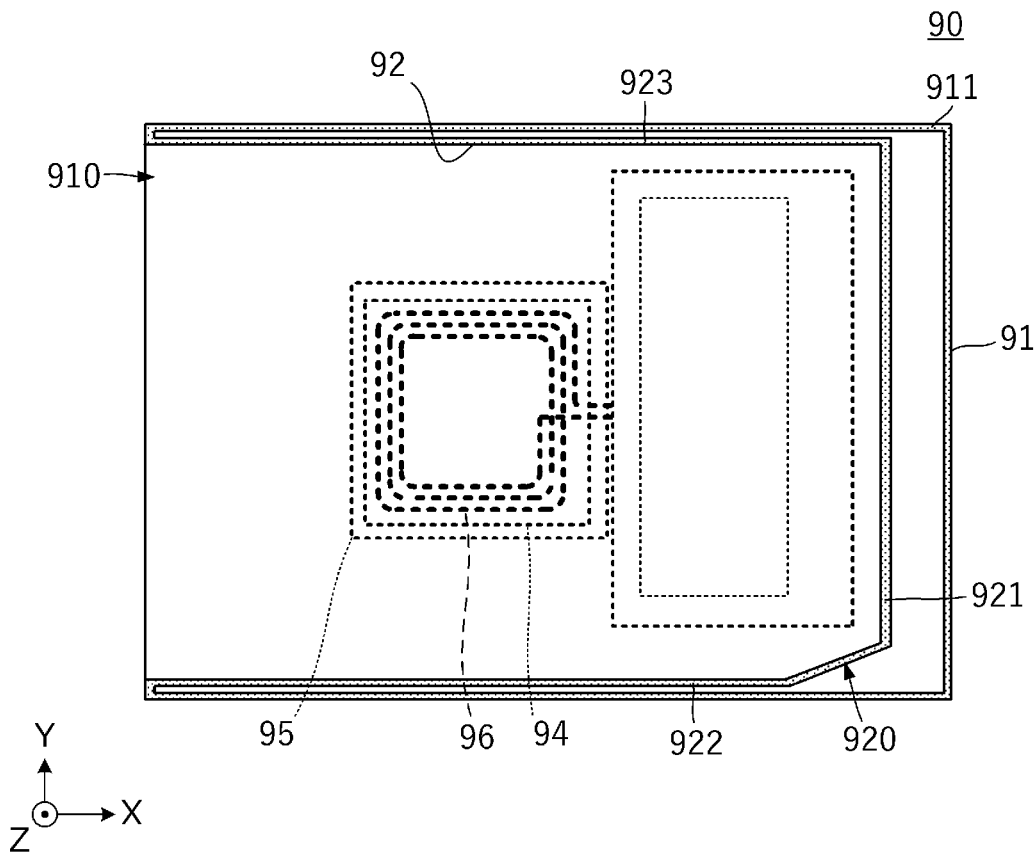
FIG. 6A is a plan view of a power-transmitting device, with an upper portion of a housing of the device being omitted.
Figure 6B:
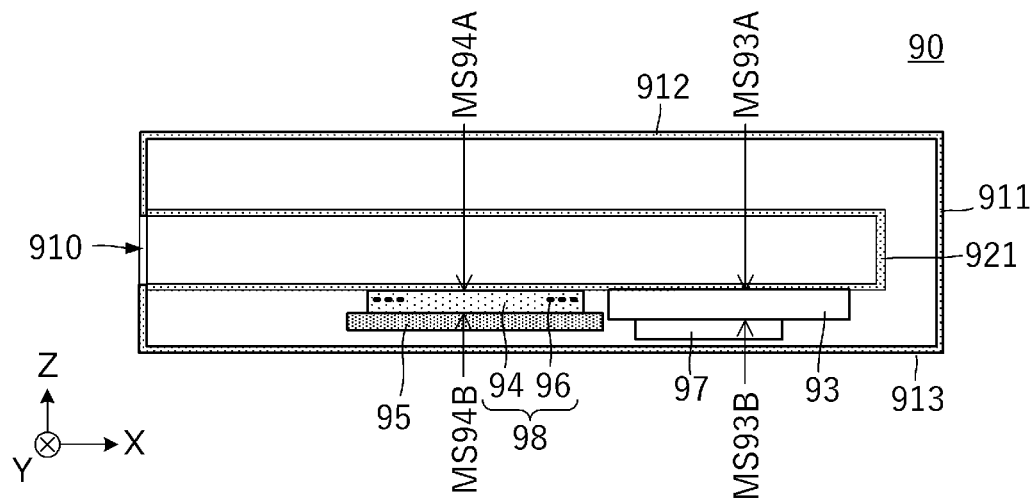
FIG. 6B is a (longitudinal) sectional view of the power-transmitting device taken along a predetermined X-Z plane.

FIG. 6A is a plan view of a power-transmitting device 90, with an upper portion of a housing of the device being omitted. FIG. 6B is a (longitudinal) sectional view of the power-transmitting device 90 taken along a predetermined X-Z plane.

As illustrated in FIGS. 6A and 6B, the power-transmitting device 90 includes a power-transmitting coil and a magnetic sheet 95. The power-transmitting coil includes a power-transmitting coil conductor 96 and a power-transmitting coil substrate 94. The power-transmitting device 90 also includes a housing 91, a substrate 93, and a power-transmitting circuit component 97.

The housing 91 has a side wall 911, a top plate 912, a bottom plate 913, and an inner wall 92. An opening 910 is provided in part of the side wall 911. The opening 910 leads to a space surrounded by the inner wall 92. The inner wall 92 includes walls 921, 922, and 923. The wall 921 is parallel to a surface in which the opening 910 is defined. The walls 922 and 923 are orthogonal to the surface in which the opening 910 is provided. An edge of the wall 921 is connected to an edge of the wall 922 via a diagonal wall 920. The diagonal wall 920 is disposed in such a manner that the interior angle between the diagonal wall 920 and the wall 921 and the interior angle between the diagonal wall 920 and the wall 922 are non-right angles, namely, obtuse angles. The wall 921, the diagonal wall 920, and the wall 922 are connected to each other so as to form a shape that substantially conforms to the shape of the cutouts of the corner sections C11 and C12 of the planar-type wireless power-receiving circuit module 102. The other edge of the wall 921 is connected to an edge of the wall 923 with a substantially right angle formed therebetween. The other edge of the wall 922 and the other edge of the wall 923 adjoin the opening 910. The inner wall 92, the opening 910, the top plate 912, and the bottom plate 913 define a space in which a power-transmitting module is disposed. The configuration of the power-transmitting module is as follows.

The power-transmitting module includes the power-transmitting coil (i.e., the power-transmitting coil conductor 96 and the power-transmitting coil substrate 94), the magnetic sheet 95, the substrate 93, and the power-transmitting circuit component 97. The power-transmitting circuit component 97 is mounted on a second main surface MS93B of the substrate 93.

The substrate 93 has a first main surface MS93A and the second main surface MS93B and includes a predetermined conductor pattern. The power-transmitting coil (i.e., the power-transmitting coil conductor 96 and the power-transmitting coil substrate 94) and the magnetic sheet 95 are configured as in FIG. 4. The power-transmitting coil substrate 94 has a first main surface MS94A and a second main surface MS94B. The substrate 93 is disposed in such a manner that the second main surface MS93B faces and is adjacent to the bottom plate 913 of the housing 91. Similarly, the power-transmitting coil substrate 94 is disposed in such a manner that the second main surface MS94B faces and is adjacent to the bottom plate 913 of the housing 91. The substrate 93 and the power-transmitting coil substrate 94 are connected to each other. The substrate 93 and the power-transmitting coil substrate 94 may be formed as one member.

The power-transmitting coil conductor 96 described above is located at substantially the midpoint between the walls 922 and 923 and at a predetermined distance from the wall 921 so as to be closer than the wall 921 to the opening 910. The predetermined distance is substantially equal to half the length of the planar-type wireless power-receiving circuit module 102 in the X direction.

Figure 7:
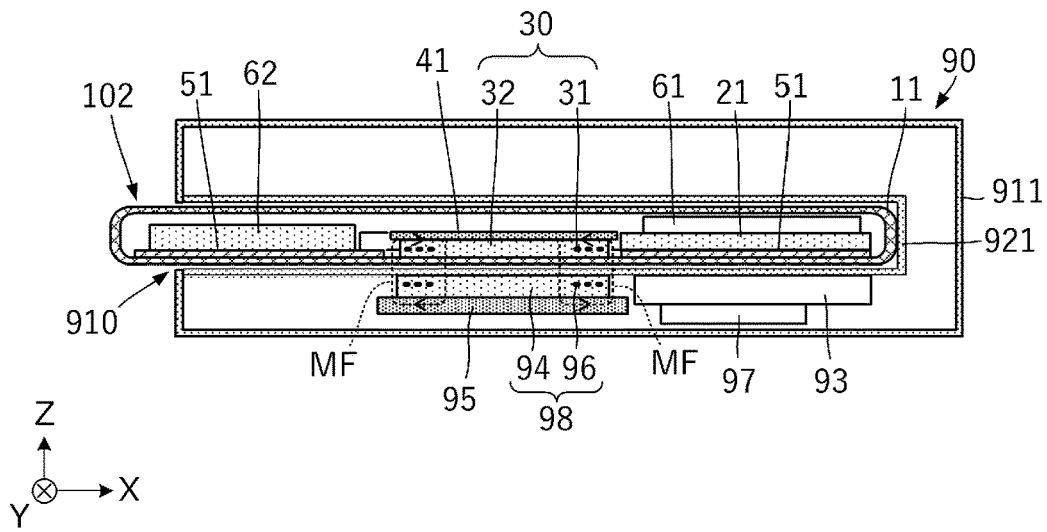
FIG. 7 is a longitudinal sectional view of the planar-type wireless power-receiving circuit module and the power-transmitting device 90 inserted therein.

FIG. 7 is a longitudinal sectional view of the power-transmitting device 90 and the planar-type wireless power-receiving circuit module 102 inserted therein. The power-transmitting device 90 described above receives the planar-type wireless power-receiving circuit module 102, which is wirelessly supplied with power accordingly.

The planar-type wireless power-receiving circuit module 102 is inserted into the power-transmitting device 90 in the X direction from the opening 910. The planar-type wireless power-receiving circuit module 102 is pushed into the power-transmitting device 90 as far as it goes until the tip of the housing 11 comes into contact with the wall 921 of the housing 91 of the power-transmitting device 90.

As can be seen from FIG. 7, the power-receiving coil conductor 31 of the planar-type wireless power-receiving circuit module 102 in this state is located directly above and adjacent to the power-transmitting coil conductor 96 of the power-transmitting module. The opening of the power-receiving coil conductor 31 and the opening of the power-transmitting coil conductor 96 overlap each other. Consequently, magnetic field coupling occurs between the power-receiving coil conductor 31 and the power-transmitting coil conductor 96, and the planar-type wireless power-receiving circuit module 102 receives power accordingly.

In the present embodiment, a fit between the planar-type wireless power-receiving circuit module 102 and the power-transmitting device 90 is ensured only when the corner section C11 or C12 of the planar-type wireless power-receiving circuit module 102 is in contact with the diagonal wall 920 of the power-transmitting device 90. This configuration ensures that the planar-type wireless power-receiving circuit module 102 will not be inserted wrong side up. This offers added safety and reliability.

The corner sections C11 and C12 of the planar-type wireless power-receiving circuit module 102 in the present embodiment have cutouts and are located diagonally opposite each other. The center of the housing 11 is located within the outline of the power-receiving coil 30 and is preferably located within the coil opening of the power-receiving coil conductor 31. More preferably, the housing 11 is concentric with the coil opening of the power-receiving coil conductor 31. The planar-type wireless power-receiving circuit module 102 can receive power once it is inserted into the power-transmitting device 90 in such a manner that either an end portion including the corner section C11 or an end portion including the corner section C12 faces toward the power-transmitting device 90. This eliminates the inconvenience of taking extra caution to insert the planar-type wireless power-receiving circuit module 102 in the correct orientation.

Third Embodiment

The following describe a third embodiment, or more specifically, a planar-type wireless power-receiving circuit module including a power-receiving coil whose configuration is different from the configurations described in the first and second embodiments.

Figure 8A:
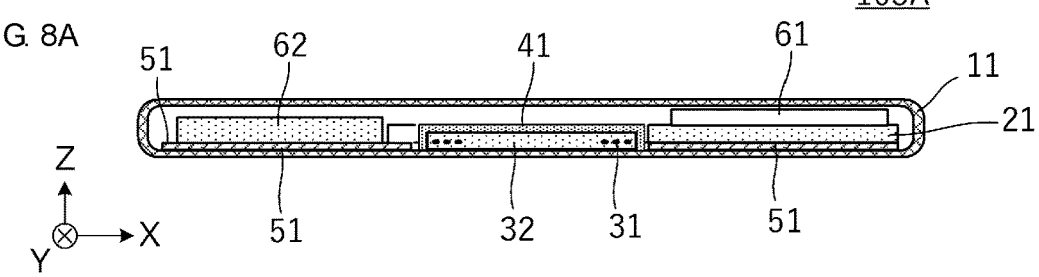
FIG. 8A is a longitudinal sectional view of a planar-type wireless power-receiving circuit module according to a third embodiment.

FIG. 8A is a longitudinal sectional view of a planar-type wireless power-receiving circuit module 103A according to the third embodiment. As is clear from comparison with the example illustrated in FIG. 1B, the magnetic sheet 41 covers not only an upper face but also four lateral faces of the power-receiving coil substrate 32. Specifically, the magnetic sheet 41 covers five outer faces of the power-receiving coil substrate 32 that are not in contact with an inner bottom face of the housing 11. The magnetic sheet on the four lateral faces is part of the magnetic path passing through a region on the outside of the coil opening of the power-receiving coil conductor 31. This structure enables the magnetic sheet 41 to serve more effectively as the path of the magnetic flux conducive to the magnetic field coupling between the power-receiving coil conductor 31 and the power-transmitting coil conductor.

Figure 8B:
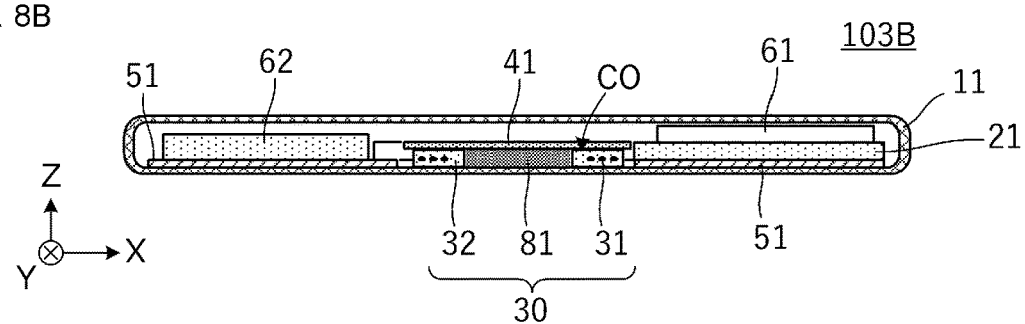
FIG. 8B is a longitudinal sectional view of a planar-type wireless power-receiving circuit module according to the third embodiment.

FIG. 8B is a longitudinal sectional view of a planar-type wireless power-receiving circuit module 103B according to the third embodiment. As is clear from comparison with the example illustrated in FIG. 1B, the power-receiving coil 30 has a coil opening CO, which is defined by the power-receiving coil conductor 31. The power-receiving coil 30 also includes a magnetic core 81, which is disposed in the coil opening CO. The magnetic core 81 in this example is disposed in such a manner that the coil opening CO is entirely sealed with the magnetic core 81. This enables the magnetic core 81 to increase the magnetic permeability exhibited in the coil opening CO defined by the power-receiving coil conductor 31 of the power-receiving coil 30. The high magnetic permeability results in a reduction in the magnetic reluctance of the magnetic path that is formed during the occurrence of the magnetic field coupling between the power-receiving coil 30 and the power-transmitting coil. Consequently, the magnetic flux passing through the power-receiving coil 30 is enhanced effectively. That is, the magnetic field coupling between the power-receiving coil 30 and the power-transmitting coil is strengthened. A wireless power supply system with improved power efficiency is provided accordingly.

Figure 8C:
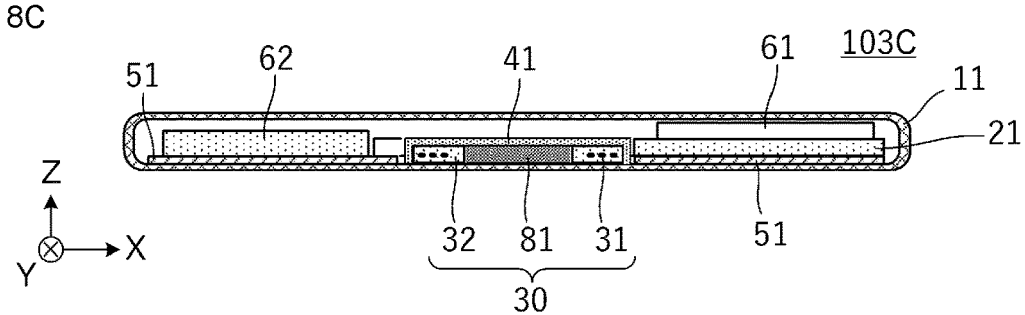
FIG. 8C is a longitudinal sectional view of a planar-type wireless power-receiving circuit module according to the third embodiment.

FIG. 8C is a longitudinal sectional view of a planar-type wireless power-receiving circuit module 103C according to the third embodiment. As in the example illustrated in FIG. 8B, the power-receiving coil 30 of the planar-type wireless power-receiving circuit module 103C includes the power-receiving coil substrate 32, the power-receiving coil conductor 31, and the magnetic core 81. As in the example illustrated in FIG. 8A, the magnetic sheet 41 covers five outer faces of the power-receiving coil substrate 32 that are not in contact with the inner bottom face of the housing 11. The magnetic field coupling between the power-receiving coil 30 and the power-transmitting coil is further strengthened, and a wireless power supply system with further improved power efficiency is provided accordingly.

Fourth Embodiment

Figure 9:
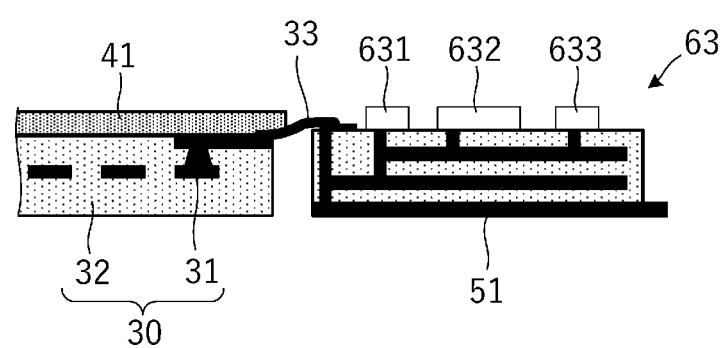
FIG. 9 is a longitudinal sectional view of a connection portion where a power-receiving circuit and a power-receiving coil of a planar-type wireless power-receiving circuit module according to a fourth embodiment are connected to each other.

The following describes a fourth embodiment, or more specifically, an example of a connecting structure that forms a connection between a power-receiving circuit and a power-receiving coil. FIG. 9 is a longitudinal sectional view of a connection portion of a planar-type wireless power-receiving circuit module according to a fourth embodiment, illustrating the power-receiving circuit 63 and the power-receiving coil 30 connected to each other. The power-receiving circuit 63 and the power-receiving coil substrate 32 are multilayer substrates. The connection portion where the power-receiving circuit 63 and the power-receiving coil 30 are connected to each other has the following structure. The power-receiving circuit 63 and the power-receiving coil substrate 32 are otherwise as described above.

The power-receiving circuit 63 is a multilayer substrate. The planar ground conductor 51 is disposed on a lower surface of the multilayer substrate, and electronic components 631, 632, and 633 are mounted on an upper surface of the multilayer substrate. End portions of the power-receiving coil conductor 31 of the power-receiving coil 30 are connected to the power-receiving circuit 63 through two respective lead wires 33.

Lastly, the above embodiments are in all aspects illustrative and not restrictive. Modifications and changes may be made as appropriate by those skilled in the art. The scope of the present disclosure is defined by the claims rather than by the above embodiments. Furthermore, changes that fall within metes and bounds of the claims or equivalence of such metes and bounds thereof are embraced by the present disclosure.

The above embodiments describe that the power-receiving coil conductor 31 is a conductor pattern formed in a multilayer substrate. In some embodiments, the power-receiving coil conductor 31 may be a winding of a conductor wire made of copper (Cu) or aluminum (Al). It is not required that the power-receiving coil conductor 31 be formed in a rigid multilayer substrate. The power-receiving coil conductor 31 may be formed in a flexible substrate.

It is not required that the conductor pattern of the power-receiving coil be a spiral. The conductor pattern may be a helix. The spiral conductor pattern offers an advantage in that the power-receiving coil can be made thinner. Meanwhile, the helical conductor pattern enables an increase in the proportion of the coil opening to the size of the power-receiving coil viewed in plan and can thus help enhance the magnetic field coupling between the power-receiving coil and the power-transmitting coil.

Enumerated below are aspects of the present disclosure that have been described so far by way of embodiments.

First Aspect

The planar-type wireless power-receiving circuit module 101 includes the planar ground conductor 51, the substrate 21, the power-receiving coil 30, and the magnetic sheet 41. The planar ground conductor 51 has the cavity H in the middle section thereof. The substrate 21 is disposed on the first main surface MS51A of the planar ground conductor 51. The substrate 21 includes dielectric layers stacked on top of each other in a manner so as to form circuitry. The power-receiving coil 30 is connected to the circuitry and is disposed in the cavity H. The magnetic sheet 41 overlaps the power-receiving coil 30 when the planar ground conductor 51 is viewed in plan. The magnetic sheet 41 is part of the path of the magnetic flux passing through the power-receiving coil 30. The magnetic sheet 41 is disposed on the first main surface MS30A of the power-receiving coil 30.

This enables the power-receiving coil 30 to allow passage of the magnetic flux with high density through the cavity H of the planar ground conductor 51. The magnetic sheet 41 that is part of the magnetic path is conducive to an increase in the density of the magnetic flux passing through the power-receiving coil 30. The planar ground conductor 51 provides magnetic shielding to isolate the circuitry in or on the substrate 21 from electric fields, and electromagnetic interference may be suppressed accordingly. The power-receiving coil and the substrate for circuits such as a power-receiving circuit are discrete components. This enables a structure suited to the power-receiving coil and less costly. The power-receiving coil and the substrate for circuits such as the power-receiving circuit do not overlap each other in the thickness direction. This enables a further reduction in the overall thickness.

Second Aspect

The power-receiving coil 30 includes a conductive wire and is electrically connected to the substrate 21. Owing to the resultant decrease in the resistive component of the power-receiving coil 30, the conductor loss may be reduced.

Third Aspect

The substrate 21 includes a conductor pattern that is part of the electronic circuitry. The conductor pattern and the power-receiving coil 30 are made of the same conductive material and are electrically connected to each other through a conductive material different from the conductive material of the conductor pattern and the power-receiving coil 30. This makes it easy to set up the electronic circuitry and the power-receiving coil 30 and provides ease of connecting the power-receiving coil 30 to the electronic circuitry.

Fourth Aspect

The substrate 21 is a rigid substrate including an insulating base that is inflexible. The power-receiving coil 30 is formed in a flexible substrate that is bendable. This enables a reduction in the overall thickness and provides ease of connecting the power-receiving coil 30 to the substrate 21.

Fifth Aspect

The magnetic sheet 41 of the planar-type wireless power-receiving circuit module 101 covers the entirety of the first main surface MS30A of the power-receiving coil 30 or covers five faces of the power-receiving coil 30, or more specifically, all faces of the power-receiving coil 30 except for the second main surface MS30B. This enables the magnetic sheet 41 to serve effectively as the magnetic path of the power-receiving coil 30. The resultant increase in the density of the magnetic flux passing through the power-receiving coil 30 helps reduce the unwanted magnetic force exerted on each circuit on the substrate 21 (i.e., the first functional circuit 64, the power-receiving circuit 63, and the second functional circuit 61) and on the secondary battery 62. Consequently, electromagnetic interference may be suppressed effectively.

Sixth Aspect

The power-receiving coil 30 of the planar-type wireless power-receiving circuit module 101 has the coil opening CO defined by the power-receiving coil conductor 31 and includes the magnetic core 81 disposed in the coil opening CO. This enables the magnetic core 81 and the magnetic sheet 41 to serve more effectively as the magnetic path of the power-receiving coil 30. Consequently, the magnetic flux passing through the power-receiving coil 30 may be enhanced effectively.

Seventh Aspect

The second main surface MS30B of the power-receiving coil 30 of the planar-type wireless power-receiving circuit module 101 is level with the second main surface MS51B of the planar ground conductor 51 or is closer to the second main surface MS51B than to the first main surface MS51A of the planar ground conductor 51. The position of the power-receiving coil 30 thus corresponds to the site where the density of the magnetic flux passing through the cavity H of the planar ground conductor 51 is high; that is, the power-receiving coil 30 allows passage of the magnetic flux with high density through the cavity H of the planar ground conductor 51.

Eighth Aspect

The planar-type wireless power-receiving circuit module 101 includes the housing 11 that is in the shape of a flat plate and accommodates the planar ground conductor 51, the substrate 21, the secondary battery 62, the power-receiving coil 30, and the magnetic sheet 41. The housing 11 is a flattened rectangular parallelepiped (in the shape of a card). When the housing 11 is viewed in plan, the center of the housing 11 is located within the outline of the power-receiving coil 30. The positional relationship between the planar-type wireless power-receiving circuit module 101 and a power-transmitting device including a wireless power-transmitting coil may thus be kept constant regardless of how the planar-type wireless power-receiving circuit module 101 is oriented.

Ninth Aspect

When viewed in plan, the housing of the planar-type wireless power-receiving circuit module 102 according to the fifth aspect has a first pair of diagonally opposite corners and a second pair of diagonally opposite corners, and the first pair and the second pair have different shapes. To receive power, the planar-type wireless power-receiving circuit module in the form of a card may thus be installed in a wireless power-transmitting device in either of two ways. Needless attempts to install the planar-type wireless power-receiving circuit module in other ways and the resultant failure in wireless power reception may be avoided accordingly.

Tenth Aspect

The planar-type wireless power-receiving circuit module 101 includes the secondary battery 62 connected to the electronic circuitry formed in the substrate 21. The secondary battery 62 and the substrate 21 lie over different regions of the planar ground conductor 51 viewed in plan. Thus, there is no overlap between the secondary battery and the substrate. This enables a reduction in the overall thickness.

What is claimed is:

1. A planar-type wireless power-receiving circuit module comprising:
    a planar ground conductor having a cavity;
    a substrate disposed on a first main surface of the planar ground conductor, the substrate including dielectric layers stacked on top of each other in a manner so as to configure electronic circuitry with electronic components mounted thereon;
    a power-receiving coil electrically connected to the electronic circuitry and disposed in the cavity; and
    a magnetic sheet that overlaps the power-receiving coil when the planar ground conductor is viewed in plan, the magnetic sheet being part of a path of magnetic flux passing through the power-receiving coil and being disposed on a first main surface of the power-receiving coil.

2. The planar-type wireless power-receiving circuit module according to claim 1, wherein
    the power-receiving coil includes a conductive wire and is electrically connected to the substrate.

3. The planar-type wireless power-receiving circuit module according to claim 2, wherein
    the substrate includes a conductor pattern that is part of the electronic circuitry, the conductor pattern and the power-receiving coil being made of the same conductive material and being electrically connected to each other through a conductive material different from the conductive material of the conductor pattern and the power-receiving coil.

4. The planar-type wireless power-receiving circuit module according to claim 2, wherein
the substrate is a rigid substrate including an insulating base that is inflexible, and
the power-receiving coil is in a flexible substrate that is bendable.

5. The planar-type wireless power-receiving circuit module according to claim 2, wherein
the magnetic sheet covers the entirety of the first main surface of the power-receiving coil or all faces of the power-receiving coil except for a second main surface of the power-receiving coil.

6. The planar-type wireless power-receiving circuit module according to claim 2, wherein
the power-receiving coil has a coil opening defined by a power-receiving coil conductor and includes a magnetic core disposed in the coil opening.

7. The planar-type wireless power-receiving circuit module according to claim 2, wherein
a second main surface of the power-receiving coil is level with a second main surface of the planar ground conductor or is closer to the second main surface than to the first main surface of the planar ground conductor.

8. The planar-type wireless power-receiving circuit module according to claim 2, further comprising:
a housing that is in a shape of a flat plate and accommodates the planar ground conductor, the substrate, the power-receiving coil, and the magnetic sheet, wherein
the housing is a flattened rectangular parallelepiped, and
when the planar ground conductor is viewed in plan, a center of the housing is located within an outline of the power-receiving coil.

9. The planar-type wireless power-receiving circuit module according to claim 2, further comprising:
a secondary battery connected to the electronic circuitry, wherein
the secondary battery and the substrate lie over different regions of the planar ground conductor viewed in plan.

10. The planar-type wireless power-receiving circuit module according to claim 1, wherein
the substrate includes a conductor pattern that is part of the electronic circuitry, the conductor pattern and the power-receiving coil being made of the same conductive material and being electrically connected to each other through a conductive material different from the conductive material of the conductor pattern and the power-receiving coil.

11. The planar-type wireless power-receiving circuit module according to claim 10, wherein
the substrate is a rigid substrate including an insulating base that is inflexible, and
the power-receiving coil is in a flexible substrate that is bendable.

12. The planar-type wireless power-receiving circuit module according to claim 10, wherein
the magnetic sheet covers the entirety of the first main surface of the power-receiving coil or all faces of the power-receiving coil except for a second main surface of the power-receiving coil.

13. The planar-type wireless power-receiving circuit module according to claim 1, wherein
the substrate is a rigid substrate including an insulating base that is inflexible, and
the power-receiving coil is in a flexible substrate that is bendable.

14. The planar-type wireless power-receiving circuit module according to claim 13, wherein
the magnetic sheet covers the entirety of the first main surface of the power-receiving coil or all faces of the power-receiving coil except for a second main surface of the power-receiving coil.

15. The planar-type wireless power-receiving circuit module according to claim 1, wherein
the magnetic sheet covers the entirety of the first main surface of the power-receiving coil or all faces of the power-receiving coil except for a second main surface of the power-receiving coil.

16. The planar-type wireless power-receiving circuit module according to claim 1, wherein
the power-receiving coil has a coil opening defined by a power-receiving coil conductor and includes a magnetic core disposed in the coil opening.

17. The planar-type wireless power-receiving circuit module according to claim 1, wherein
a second main surface of the power-receiving coil is level with a second main surface of the planar ground conductor or is closer to the second main surface than to the first main surface of the planar ground conductor.

18. The planar-type wireless power-receiving circuit module according to claim 1, further comprising:
a housing that is in a shape of a flat plate and accommodates the planar ground conductor, the substrate, the power-receiving coil, and the magnetic sheet, wherein
the housing is a flattened rectangular parallelepiped, and
when the planar ground conductor is viewed in plan, a center of the housing is located within an outline of the power-receiving coil.

19. The planar-type wireless power-receiving circuit module according to claim 18, wherein
when the planar ground conductor is viewed in plan, the housing has a first pair of diagonally opposite corners and a second pair of diagonally opposite corners, the first pair and the second pair having different shapes.

20. The planar-type wireless power-receiving circuit module according to claim 1, further comprising:
a secondary battery connected to the electronic circuitry, wherein
the secondary battery and the substrate lie over different regions of the planar ground conductor viewed in plan.

* * * * *